US012601875B2

(12) United States Patent
Yu et al.

(10) Patent No.: US 12,601,875 B2
(45) Date of Patent: Apr. 14, 2026

(54) OPTICAL DEVICE AND METHOD OF MANUFACTURE

(71) Applicant: Taiwan Semiconductor Manufacturing Co., Ltd., Hsinchu (TW)

(72) Inventors: Chen-Hua Yu, Hsinchu (TW); Sey-Ping Sun, Hsinchu (TW); Shih Wei Liang, Taichung City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 51 days.

(21) Appl. No.: 18/340,685

(22) Filed: Jun. 23, 2023

(65) Prior Publication Data

US 2024/0280752 A1 Aug. 22, 2024

Related U.S. Application Data

(60) Provisional application No. 63/491,129, filed on Mar. 20, 2023, provisional application No. 63/486,275, filed on Feb. 22, 2023.

(51) Int. Cl.
*G02B 6/13* (2006.01)
*C30B 25/02* (2006.01)
*G02B 6/12* (2006.01)

(52) U.S. Cl.
CPC .............. *G02B 6/131* (2013.01); *C30B 25/02* (2013.01); *G02B 2006/12169* (2013.01)

(58) Field of Classification Search
CPC .......... G02B 6/131; G02B 2006/12169; C30B 25/02
See application file for complete search history.

(56) References Cited

U.S. PATENT DOCUMENTS

| | | | |
|---|---|---|---|
| 8,148,732 B2 | 4/2012 | Yu et al. | |
| 12,164,184 B2 | 12/2024 | Liang et al. | |
| 2009/0224240 A1* | 9/2009 | Shinagawa ............ | B82Y 20/00 257/E33.013 |
| 2020/0303890 A1* | 9/2020 | Kim ...................... | H01S 5/4062 |
| 2021/0167231 A1* | 6/2021 | Cardwell .............. | H01L 31/109 |
| 2022/0244583 A1* | 8/2022 | Liang ..................... | G02F 1/035 |
| 2024/0258462 A1 | 8/2024 | Tsuchiya et al. | |

FOREIGN PATENT DOCUMENTS

| | | |
|---|---|---|
| CN | 114830332 A | 7/2022 |
| TW | 201010147 A | 3/2010 |
| TW | 202307294 A | 2/2023 |

* cited by examiner

*Primary Examiner* — Kelly M Gambetta
(74) *Attorney, Agent, or Firm* — Slater Matsil, LLP

(57) ABSTRACT

Optical devices and methods of manufacture are provided which form a first active layer of optical devices. After the first active layer of optical devices is formed, a second active layer of optical devices is manufactured over the first active layer of optical devices, wherein the second active layer of optical devices is formed to create the optical devices with crystalline material.

20 Claims, 15 Drawing Sheets

FIG. 6

OPTICAL DEVICE AND METHOD OF MANUFACTURE

PRIORITY CLAIM AND CROSS-REFERENCE

This application claims the benefit of U.S. Provisional Application No. 63/486,275, filed on Feb. 22, 2023, and U.S. Provisional Application No. 63/491,129, filed on Mar. 20, 2023, which applications are hereby incorporated herein by reference.

BACKGROUND

Electrical signaling and processing are one technique for signal transmission and processing. Optical signaling and processing have been used in increasingly more applications in recent years, particularly due to the use of optical fiber-related applications for signal transmission.

Optical signaling and processing are typically combined with electrical signaling and processing to provide full-fledged applications. For example, optical fibers may be used for long-range signal transmission, and electrical signals may be used for short-range signal transmission as well as processing and controlling. Accordingly, devices integrating long-range optical components and short-range electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 illustrates formation of a metallization layer, in accordance with some embodiments.

DETAILED DESCRIPTION

Figure 1:
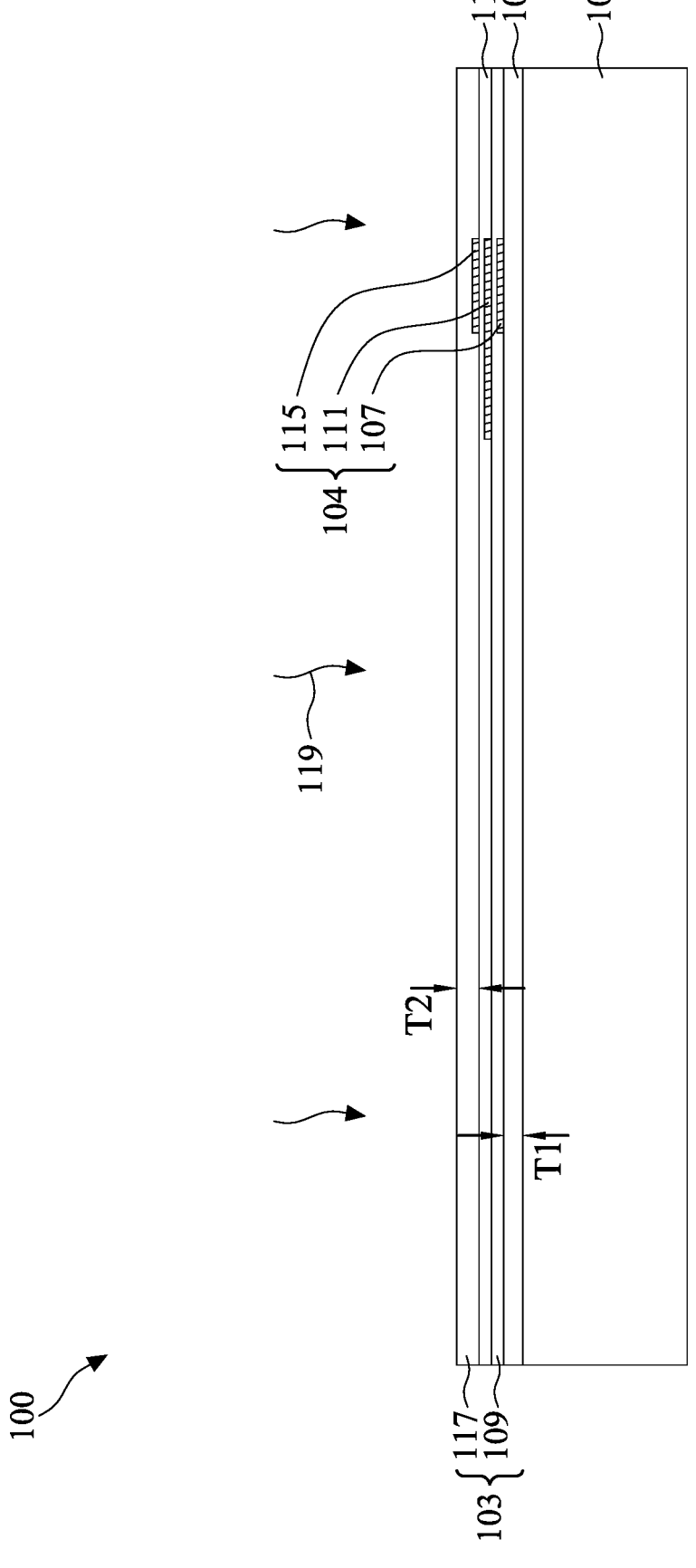
FIG. 1 illustrates formation of a first active layer of optical components, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment of an optical engine (OE) in which optical waveguides (and/or other optical components) are manufactured prior to a front end of line manufacturing of optical components in order to avoid the thermal limitations that are present after the front end of line optical components have been formed. However, the embodiments presented herein are intended to be illustrative of the ideas presented, and are not intended to be limiting. As such, the ideas presented can be implemented in a large variety of embodiments, such as in optical computing (OC) or co-package optics (CPO) in N3-N7 process nodes, and all such embodiments are fully intended to be included within the scope of the embodiments.

Figure 6:
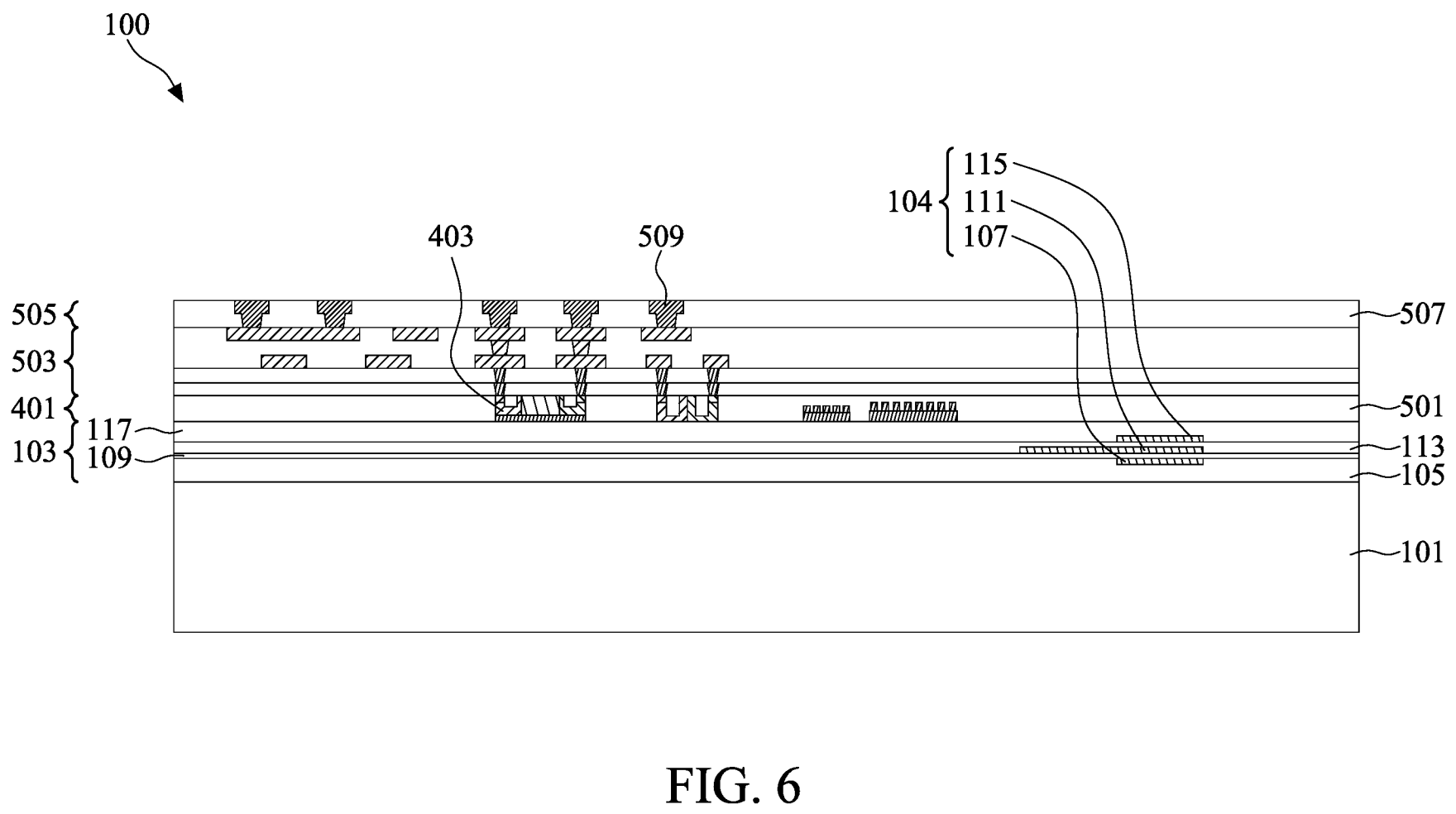

With reference now to FIG. 1, there is illustrated an initial structure of a first substrate 101 with a first active layer 103 of first optical components 104 formed over the first substrate 101, which are first steps in the formation of an optical engine 100 (illustrated as more complete in FIG. 6 and illustrated in FIG. 1 at an intermediate step in the manufacturing process). Looking first at the first substrate 101, the first substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Additionally, the first substrate 101 at this point in the process may be part of a semiconductor wafer (the full wafer of which is not illustrated in FIG. 1) that will be singulated in a later step.

The first active layer 103 of first optical components 104 are formed over the first substrate 101. In an embodiment the first optical components 104 located within the first active layer 103 comprise a wide variety of optical components that may be annealed at a higher temperature than subsequently manufactured devices (discussed further below), such as optical waveguides (e.g., ridge waveguides, rib waveguides, buried channel waveguides, diffused waveguides, etc.), couplers (e.g., grating couplers, edge couplers that are a narrowed waveguide with a width of between about 1 nm and about 200 nm, etc.), directional couplers, optical modulators (e.g., Mach-Zehnder silicon-photonic switches, microelectromechanical switches, micro-ring resonators, etc.), amplifiers, multiplexors, demultiplexors, combinations of these, or the like. However, any suitable first optical components 104 may be used.

In a particular embodiment, and as particularly illustrated in FIG. 1, the first optical components 104 within the first active layer 103 comprise a first cladding layer 105, a first waveguide 107, a second cladding layer 109, a second waveguide 111, a third cladding layer 113, a third waveguide 115, and a fourth cladding layer 117. In an embodiment the first cladding layer 105 may be a cladding material and/or dielectric layer such as silicon oxide, silicon nitride, germanium oxide, germanium nitride, combinations of these, or the like, formed using a deposition method such as thermal oxidation, a low temperature plasma enhanced chemical vapor deposition, other chemical vapor deposition processes, atomic layer deposition, physical vapor deposition, combinations of these, or the like. However, any suitable material and method of manufacture may be utilized.

Additionally, given the benefits that are obtained using the embodiments described herein, the first cladding layer 105 may be formed to a thickness reduced from previous manufacturing methods. For example, in some embodiments the first cladding layer 105 may be manufactured to a first thickness $T_1$ of less than about 4 μm, such as between about 2 μm and about 4 μm. If the first thickness $T_1$ is smaller than this thickness, the first cladding layer 105 may not be sufficient to provide suitable cladding for the first waveguide 107 (and/or other optical components). Also, if the first thickness $T_1$ is larger than this thickness, then the overall thickness of the device may be larger than desired.

Once the first cladding layer 105 has been formed, the first waveguide 107 may be formed over the first cladding layer 105. In an embodiment the first waveguide 107 may be any suitable type of waveguide (e.g., ridge waveguides, rib waveguides, buried channel waveguides, diffused waveguides, etc.) and may be formed by initially depositing a core material such as silicon nitride, a-silicon (amorphous Si), AlN, $Al_2O_3$, $Ta_2O_5$, combinations of these, or the like using a deposition method such as chemical vapor deposition, physical vapor deposition, atomic layer deposition, combinations of these, or the like to a thickness of between about 0.1 μm and about 1 μm. Once the core material has been deposited over the first cladding layer 105, the core material is patterned into the designed shape for the first waveguide 107 using, e.g., a photolithographic masking and etching process. However, any suitable materials, thicknesses, and methods of manufacture may be utilized.

After the first waveguide 107 has been formed, the second cladding layer 109 is formed over the first waveguide 107. In an embodiment the second cladding layer 109 may be formed using similar materials and methods of formation as the first cladding layer 105 described above, such as depositing a material such as silicon oxide using a deposition method such as a low temperature plasma enhanced chemical vapor deposition. However, any suitable materials and methods of manufacturing may be utilized.

After the second cladding layer 109 has been formed, the second waveguide 111 may be formed over the second cladding layer 109. In an embodiment the second waveguide 111 may be formed using similar materials and similar methods of manufacture as the first waveguide 107 described above such as depositing a material such as silicon nitride using chemical vapor deposition. However, any suitable materials and methods of manufacturing may be utilized.

After the second waveguide 111 has been formed, the third cladding layer 113 may be formed over the second waveguide 111. In an embodiment the third cladding layer

113 may be formed using similar materials and methods of formation as the first cladding layer 105 described above, such as depositing a material such as silicon oxide using a deposition method such as a low temperature plasma enhanced chemical vapor deposition. However, any suitable materials and methods of manufacturing may be utilized.

After the third cladding layer 113 has been formed, the third waveguide 115 may be formed over the third cladding layer 113. In an embodiment the third waveguide 115 may be formed using similar materials and similar methods of manufacture as the first waveguide 107 described above such as depositing a material such as silicon nitride using chemical vapor deposition. However, any suitable materials and methods of manufacturing may be utilized.

Once the third waveguide 115 has been formed, the fourth cladding layer 117 may be formed over the third waveguide 115. In an embodiment the fourth cladding layer 117 may be a cladding material such as silicon oxide, silicon nitride, germanium oxide, germanium nitride, combinations of these, or the like, formed using a deposition method such as thermal oxidation, a low temperature plasma enhanced chemical vapor deposition, other chemical vapor deposition processes, atomic layer deposition, physical vapor deposition, combinations of these, or the like.

Additionally, given the benefits that are obtained using the embodiments described herein, the fourth cladding layer 117 may be formed to a thickness reduced from previous manufacturing methods. For example, in some embodiments the fourth cladding layer 117 may be manufactured to a second thickness $T_2$ of less than about 4 μm, such as between about 2 μm and about 4 μm. If the second thickness $T_2$ is smaller than this thickness, the fourth cladding layer 117 may not be sufficient to provide suitable cladding for the third waveguide 115 (and/or other optical components). Also, if the second thickness $T_2$ is larger than this thickness, then the overall thickness of the device may be larger than desired.

Once the first waveguide 107, the second waveguide 111, and the third waveguide 115 have been formed, the first waveguide 107, the second waveguide 111, and the third waveguide 115 may be annealed with, e.g., a first anneal process (represented in FIG. 1 by the curved arrows labeled 119). In an embodiment the first anneal process 119 may be a thermal anneal process performed at a temperature that is unconstrained by the presence of other optical devices that have not yet been manufactured (e.g., the second active layer 401 seen below with respect to FIG. 4). In particular embodiments the first anneal process 119 may be performed at a temperature of between about 1100° C. and about 1250° C. However, any other suitable annealing process and suitable temperature may be utilized.

Additionally, while the first anneal process 119 is described above as being performed after each of the first waveguide 107, the second waveguide 111, and the third waveguide 115 have been formed, this is intended to be illustrative and is not intended to be limiting. Rather, any number of anneals may be performed at any suitable point within the manufacturing process. For example, the first anneal process 119 may be repeated multiple times, such as by being performed after the manufacture of each of the first waveguide 107, the second waveguide 111, and the third waveguide 115. Any suitable number of anneals at any suitable points in the manufacturing process may be utilized, and all such combinations are fully intended to be included within the scope of the embodiments.

By forming the first waveguide 107, the second waveguide 111, and the third waveguide 115 prior to forming other optical components, the first anneal process 119 may be performed at a higher temperature that reduces impurities within the first waveguide 107, the second waveguide 111, and the third waveguide 115. By reducing the impurities within the first waveguide 107, the second waveguide 111, and the third waveguide 115, less cladding material may be used around the first waveguide 107, the second waveguide 111, and the third waveguide 115, and the thicknesses of the surrounding cladding materials (e.g., the first cladding layer 105 and the fourth cladding layer 117) may be further reduced. Additionally, the higher temperature can be performed without negatively affecting the other optical components that haven't yet been manufactured.

Figure 2:
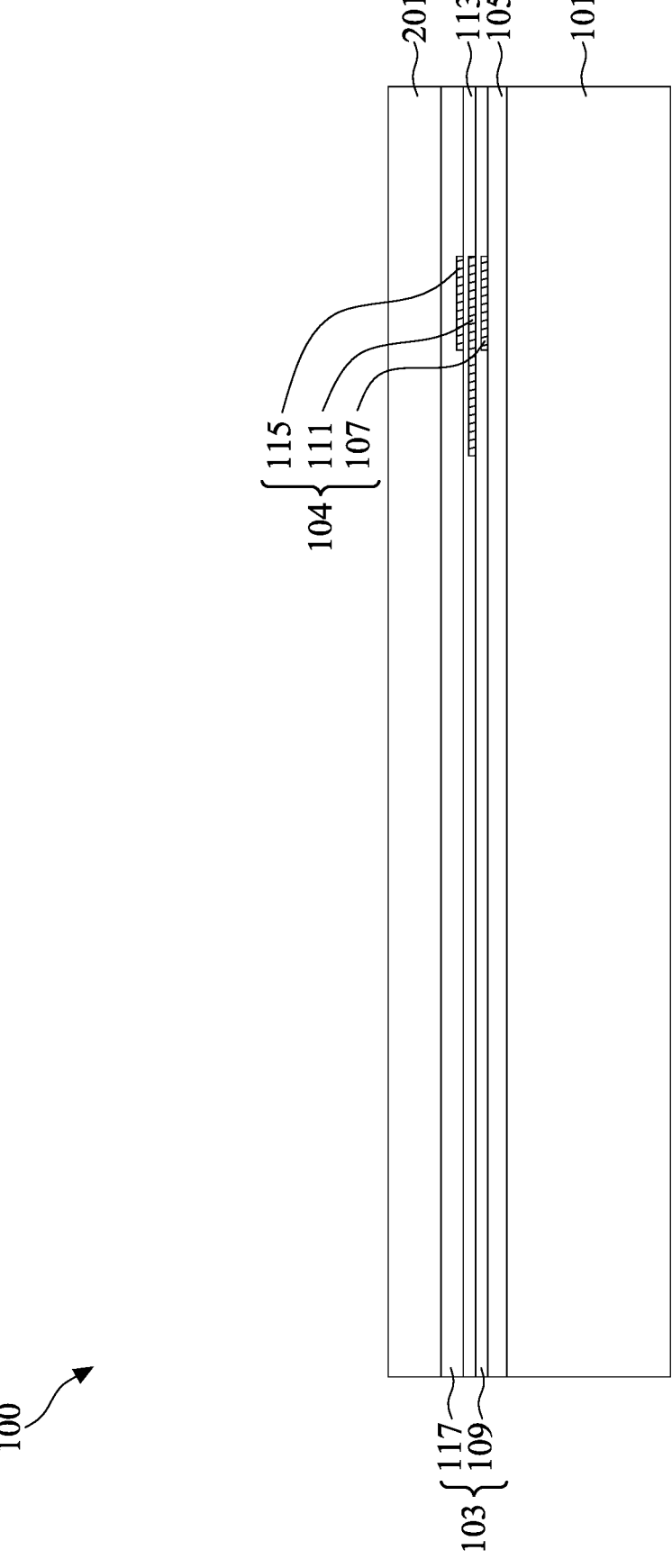
FIG. 2 illustrates deposition of a crystalline insulator layer, in accordance with some embodiments.

FIG. 2 illustrates the start of the manufacture of additional optical components once the first anneal process 119 has been performed. In a particular embodiment the manufacture of the additional optical components may be started by first forming a crystalline insulator layer 201 over the fourth cladding layer 117 as an opening step in an epitaxy on insulator (EOI) process. In an embodiment the crystalline insulator layer 201 is a material that can be used as a seed layer for a subsequent epitaxial growth (not illustrated in FIG. 2 but illustrated and described further below with respect to FIG. 3), such as beryllium oxide (BeO), aluminum nitride (AlN), combinations of these, or the like. The crystalline insulator layer 201 may be formed using a deposition process that can deposit the material as a single crystal even though the underlying material is not crystalline, such as atomic layer deposition, chemical vapor deposition, physical vapor deposition, combinations of these, or the like. However, any suitable material and any suitable deposition process may be utilized.

Figure 3:
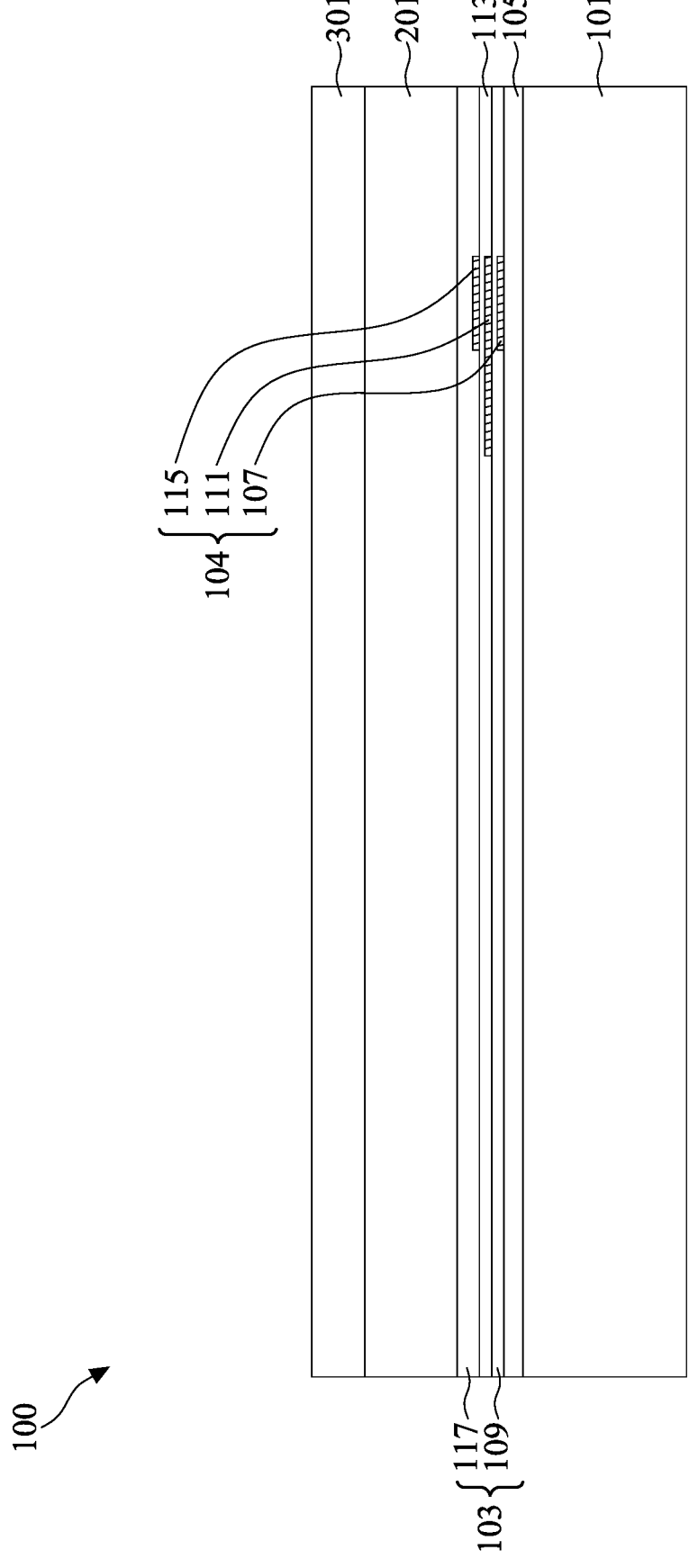
FIG. 3 illustrates deposition of a crystalline layer, in accordance with some embodiments.

FIG. 3 illustrates deposition of a layer of material 301 for a second active layer 401 of second optical components 403. The material 301 for the second active layer 401 is initially (prior to patterning) a conformal layer of crystalline material that will be used to begin manufacturing the second active layer 401 of the second optical components 403 (not illustrated in FIG. 3 but illustrated and described further below with respect to FIG. 4). In an embodiment the material 301 for the second active layer 401 may be a translucent material that can be used as a core material for the second optical components 403, such as a semiconductor material like silicon, germanium, silicon germanium, combinations of these, or the like, while in other embodiments the material 301 for the second active layer 401 may be a dielectric material such as silicon nitride or the like, although in other embodiments the material 301 for the second active layer 401 may be III-V materials, lithium niobate materials, or polymers. Any suitable material may be utilized.

In embodiments in which the material 301 of the second active layer 401 is single crystalline silicon, the material 301 may be deposited with a method such as epitaxial growth using the crystalline insulator layer 201 as a seed layer, although in other embodiments other deposition methods such as chemical vapor deposition, atomic layer deposition, physical vapor deposition, combinations of these, or the like, may also be used. Additionally, in this embodiment the layer of material 301 may be grown or otherwise deposited to a thickness of between about 200 nm and about 500 nm. However, any suitable method of manufacture and thickness may be utilized.

Figure 4:
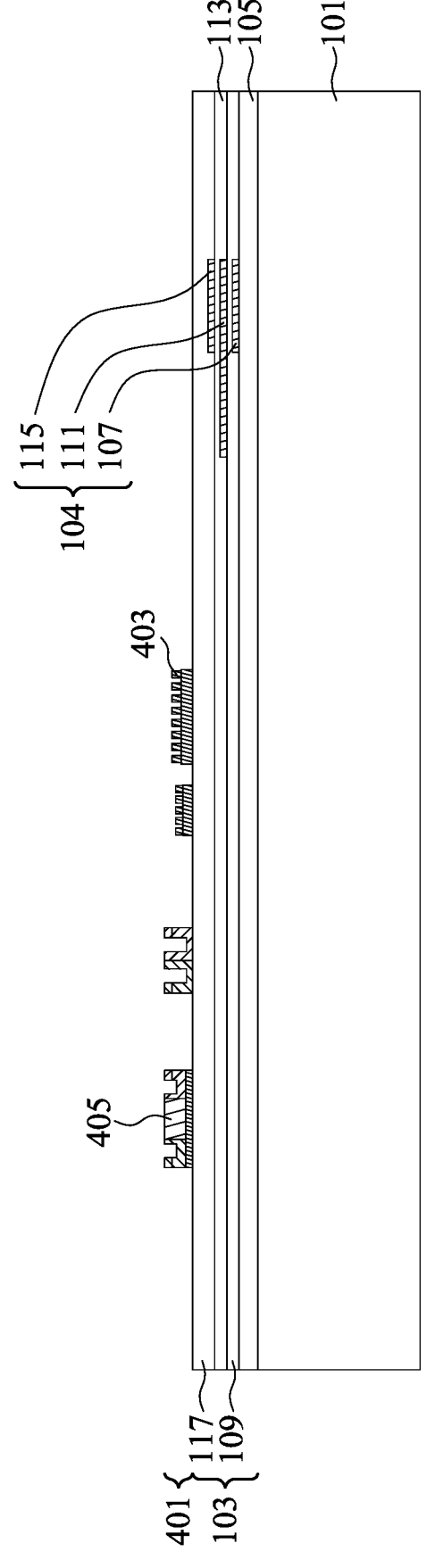
FIG. 4 illustrates formation of optical components, in accordance with some embodiments.

FIG. 4 illustrates that, once the material 301 for the second active layer 401 is ready, the second optical components 403 for the second active layer 401 are manufactured using the material 301 for the second active layer 401. Additionally, for the purposes of clarity, any remaining material of the crystalline insulator layer 201 is not illustrated. In embodiments the second optical components 403 of the second active layer 401 may include any one of a variety of photonic devices according to the designed device, and may include any such components like optical waveguides, couplers, modulators, amplifiers, multiplexors, demultiplexors, optical-to-electrical converters, electrical-to-optical converters, lasers, combinations of these, or the like. FIG. 4 illustrates four such devices, such as a first device, a second device, a third device, and a fourth device, which may be one or more optical devices, active devices (e.g., transistors), passive devices, or combinations thereof. However, any suitable second optical components 403 and any suitable combination of devices may be used.

To begin forming the second active layer 401 of second optical components 403 from the material 301, the material 301 for the second active layer 401 may be patterned into the designed shapes for the second active layer 401 of second optical components 403. In an embodiment the material 301 for the second active layer 401 may be patterned using, e.g., one or more photolithographic masking and etching processes. However, any suitable method of patterning the material 301 for the second active layer 401 may be utilized.

For those components that utilize further manufacturing processes, additional processing may be performed either before or after the patterning of the material 301 for the second active layer 401. For example, implantation processes, additional deposition and patterning processes for different materials, combinations of all of these processes, or the like, can be utilized to help further the manufacturing of the various second optical components 403. In a particular embodiment, and as specifically illustrated in FIG. 4, in some embodiments an epitaxial deposition of a semiconductor material 405 such as germanium may be performed on a patterned portion of the material 301 of the second active layer 401. In such an embodiment the material 301 may be epitaxially grown in order to help manufacture the second optical components 403 of the second active layer 401. All such manufacturing processes may be utilized and all suitable second optical components 403 may be manufactured, and all such combinations are fully intended to be included within the scope of the embodiments.

Figure 5:
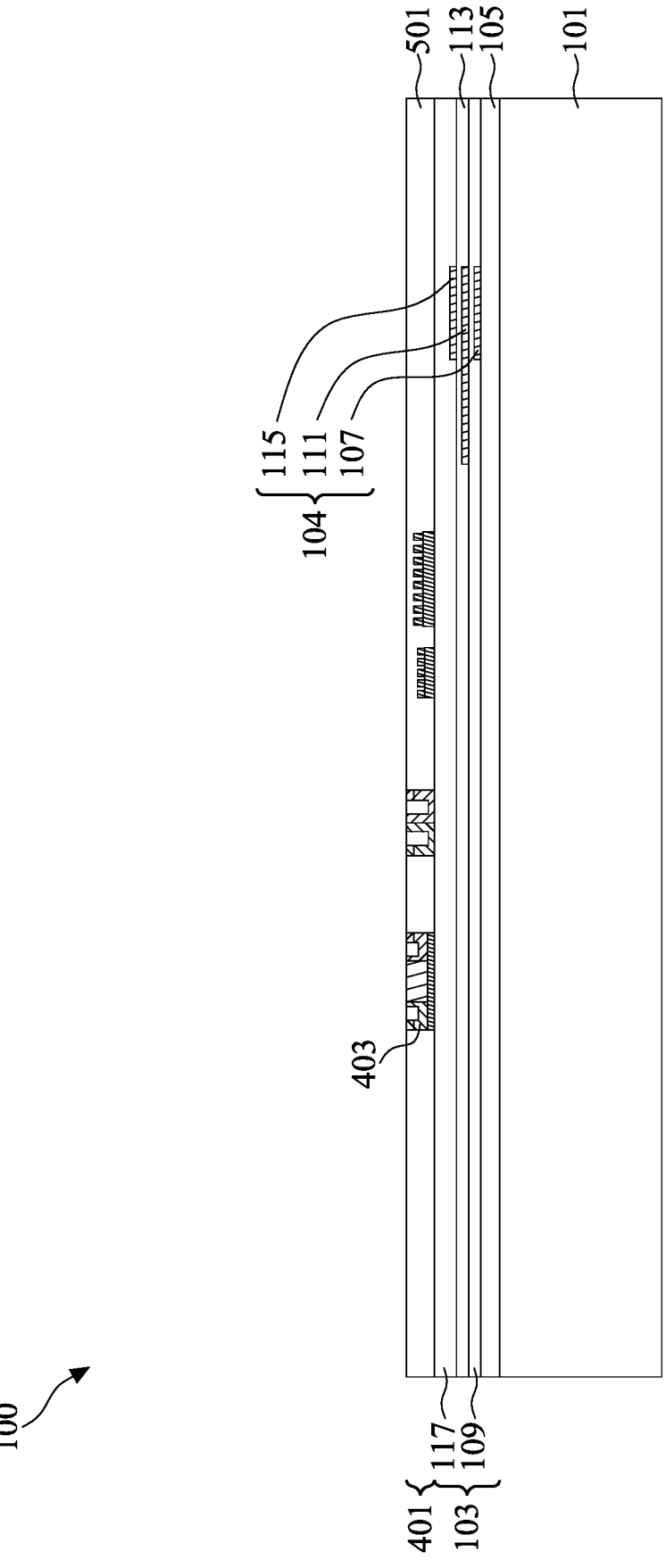
FIG. 5 illustrate formation of cladding material around the optical components, in accordance with some embodiments.

FIG. 5 illustrates that, once the individual second optical components 403 of the second active layer 401 have been formed, a second insulator layer 501 may be deposited to cover the second optical components 403 and provide additional cladding material. In an embodiment the second insulator layer 501 may be a dielectric layer that separates the individual components of the second active layer 401 from each other and from the overlying structures and can additionally serve as another portion of cladding material that surrounds the second optical components 403. In an embodiment the second insulator layer 501 may be silicon oxide, silicon nitride, germanium oxide, germanium nitride, combinations of these, or the like, formed using a deposition method such as chemical vapor deposition, atomic layer deposition, physical vapor deposition, combinations of these, or the like. Once the material of the second insulator layer 501 has been deposited, the material may be planarized using, e.g., a chemical mechanical polishing process in order to either planarize a top surface of the second insulator layer 501 (in embodiments in which the second insulator layer 501 is intended to fully cover the second optical components 403) or else planarize the second insulator layer 501 with top surfaces of the second optical components 403. However, any suitable material and method of manufacture may be used.

FIG. 6 illustrates that, once the second optical components 403 of the second active layer 401 have been manufactured and the second insulator layer 501 has been formed, first metallization layers 503 are formed in order to electrically connect the second active layer 401 of second optical components 403 to control circuitry, to each other, and to subsequently attached devices (not illustrated in FIG. 6). In an embodiment the first metallization layers 503 are formed of alternating layers of dielectric and conductive material and may be formed through any suitable processes (such as deposition, damascene, dual damascene, etc.). In particular embodiments there may be multiple layers of metallization used to interconnect the various second optical components 403, but the precise number of first metallization layers 503 is dependent at least in part upon the design of the device.

Optionally, during the manufacture of the first metallization layers 503, one or more third optical components (not separately illustrated) may be formed as part of the first metallization layers 503. In some embodiments the third optical components of the first metallization layers 503 may include such components as couplers (e.g., edge couplers, grating couplers, etc.) for connection to outside signals, optical waveguides (e.g., ridge waveguides, rib waveguides, buried channel waveguides, diffused waveguides, etc.), optical modulators (e.g., Mach-Zehnder silicon-photonic switches, microelectromechanical switches, micro-ring resonators, etc.), amplifiers, multiplexors, demultiplexors, optical-to-electrical converters (e.g., P-N junctions), electrical-to-optical converters, lasers, combinations of these, or the like. However, any suitable optical components may be used for the one or more third optical components.

In an embodiment the one or more third optical components may be formed by initially depositing a material for the one or more third optical components. In an embodiment the material for the one or more third optical components may be a dielectric material such as silicon nitride, silicon oxide, combinations of these, or the like, or a semiconductor material such as silicon, deposited using a deposition method such as chemical vapor deposition, atomic layer deposition, physical vapor deposition, combinations of these, or the like. However, any suitable material and any suitable method of deposition may be utilized.

Once the material for the one or more third optical components has been deposited or otherwise formed, the material may be patterned into the designed shapes for the one or more third optical components. In an embodiment the material of the one or more third optical components may be patterned using, e.g., one or more photolithographic masking and etching processes. However, any suitable method of patterning the material for the one or more third optical components may be utilized.

For some of the one or more third optical components, such as waveguides or edge couplers, the patterning process may be all or at least most manufacturing that is used to form these components. Additionally, for those components that utilize further manufacturing processes, such as Mach-Zehnder silicon-photonic switches that utilize resistive heating elements, additional processing may be performed either before or after the patterning of the material for the one or more third optical components. For example, implantation processes, additional deposition and patterning processes for different materials, combinations of all of these processes, or the like, and can be utilized to help further the manufacturing of the various one or more third optical components. All such manufacturing processes may be utilized and all suitable one or more third optical components may be manufactured, and all such combinations are fully intended to be included within the scope of the embodiments.

Additionally, in some embodiments the third optical components may be annealed after being patterned. In such embodiments, the annealing of the third optical components takes into account the presence of the second optical components 403, which have already been manufactured. As such, the third optical components may be annealed at a temperature less than about 450° C. However, any suitable temperature may be utilized.

Once the one or more third optical components of the first metallization layers 503 have been manufactured, a first bonding layer 505 is formed over the first metallization layers 503. In an embodiment, the first bonding layer 505 may be used for a subsequent dielectric-to-dielectric and metal-to-metal bond. In accordance with some embodiments, the first bonding layer 505 is formed of a first dielectric material 507 such as silicon oxide, silicon nitride, or the like. The first dielectric material 507 may be deposited using any suitable method, such as CVD, high-density plasma chemical vapor deposition (HDPCVD), PVD, atomic layer deposition (ALD), or the like. However, any suitable materials and deposition processes may be utilized.

Once the first dielectric material 507 has been formed, first openings in the first dielectric material 507 are formed to expose conductive portions of the underlying layers in preparation to form first bond pads 509 within the first bonding layer 505. Once the first openings have been formed within the first dielectric material 507, the first openings may be filled with a seed layer and a plated metal to form the first bond pads 509 within the first dielectric material 507. The seed layer may be blanket deposited over top surfaces of the first dielectric material 507 and the exposed conductive portions of the underlying layers and sidewalls of the openings and the first openings. The seed layer may comprise a copper layer. The seed layer may be deposited using processes such as sputtering, evaporation, or plasma-enhanced chemical vapor deposition (PECVD), or the like, depending upon the materials. The plated metal may be deposited over the seed layer through a plating process such as electrical or electro-less plating. The plated metal may comprise copper, a copper alloy, or the like. The plated metal may be a fill material. A barrier layer (not separately illustrated) may be blanket deposited over top surfaces of the first dielectric material 507 and sidewalls of the openings and the first openings before the seed layer. The barrier layer may comprise titanium, titanium nitride, tantalum, tantalum nitride, or the like.

Following the filling of the first openings, a planarization process, such as a CMP, is performed to remove excess portions of the seed layer and the plated metal, forming the first bond pads 509 within the first bonding layer 505. In some embodiments a bond pad via may also be utilized to connect the first bond pads 509 with underlying conductive portions and, through the underlying conductive portions, connect the first bond pads 509 with the first metallization layers 503.

Additionally, the first bonding layer 505 may also include one or more fourth optical components (not separately illustrated) incorporated within the first bonding layer 505. In such an embodiment, prior to the deposition of the first dielectric material 507, the one or more fourth optical components may be manufactured using similar methods and similar materials as the one or more third optical components (described above), such as by being waveguides and other structures formed at least in part through a deposition and patterning process. However, any suitable structures, materials and any suitable methods of manufacture may be utilized.

By forming the first active layer 103 of the first optical components 104 prior to forming any crystalline materials (used, e.g., for the formation of the second optical components 403 in the second active layer 401), the materials within the first active layer 103 of the first optical components 104 may be annealed at a higher temperature that is not limited by the temperatures for the subsequent crystalline materials (usually less than 450° C.). As such, the higher temperatures may be used in order to reduce defects within the materials for the first active layer 103 of the first optical components 104, thereby improving the overall quality of the materials for the first active layer 103 of the first optical components 104, and optical losses may be reduced. With such a reduction in optical losses within the first optical components 104, the surrounding cladding materials (e.g., the first cladding layer 105, the second cladding layer 109, the third cladding layer 113, and the fourth cladding layer 117) may also be formed to a smaller thickness, such as a 50% reduction in thickness, thereby reducing the overall thickness of the device.

Additionally, by forming the first active layer 103 of the first optical components 104 on a first substrate 101, the use of a silicon-on-insulator (SOI) substrate can become optional in the overall manufacturing process. For example, the usual use of the SOI substrate can be substituted for a single material substrate such as a silicon substrate. As such, a less expensive substrate may be used and a more cost-efficient manufacturing process may be obtained.

Figure 7:
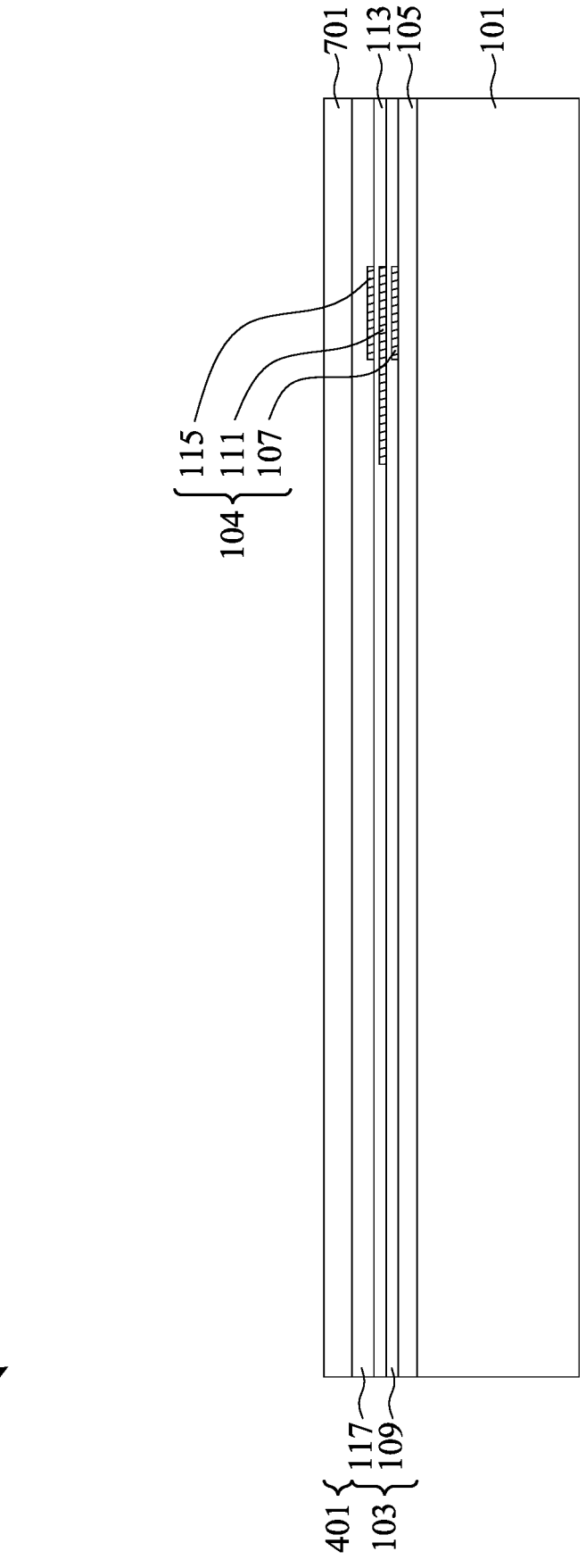
FIGS. 7-11 illustrate formation of the optical components using an amorphous layer and annealing process, in accordance with some embodiments.
Figure 8:
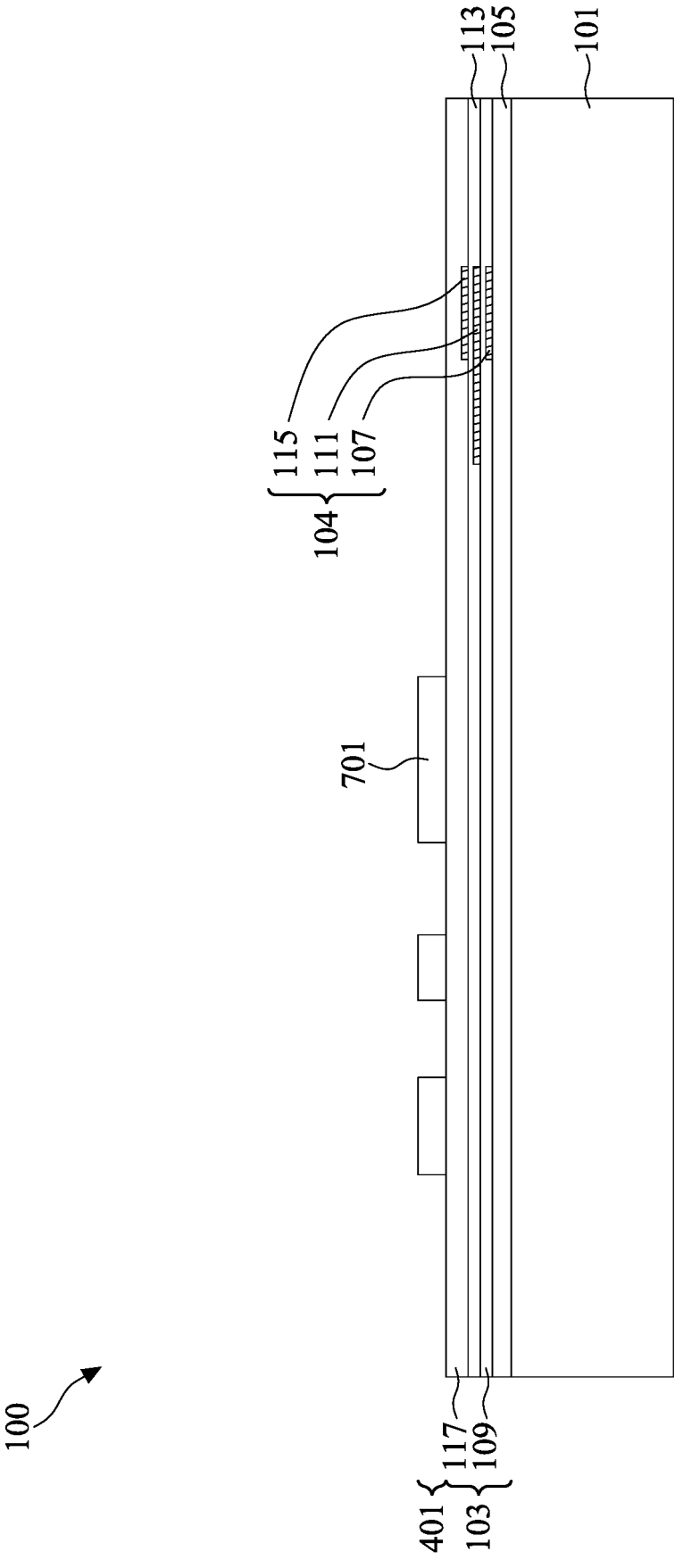
Figure 9:
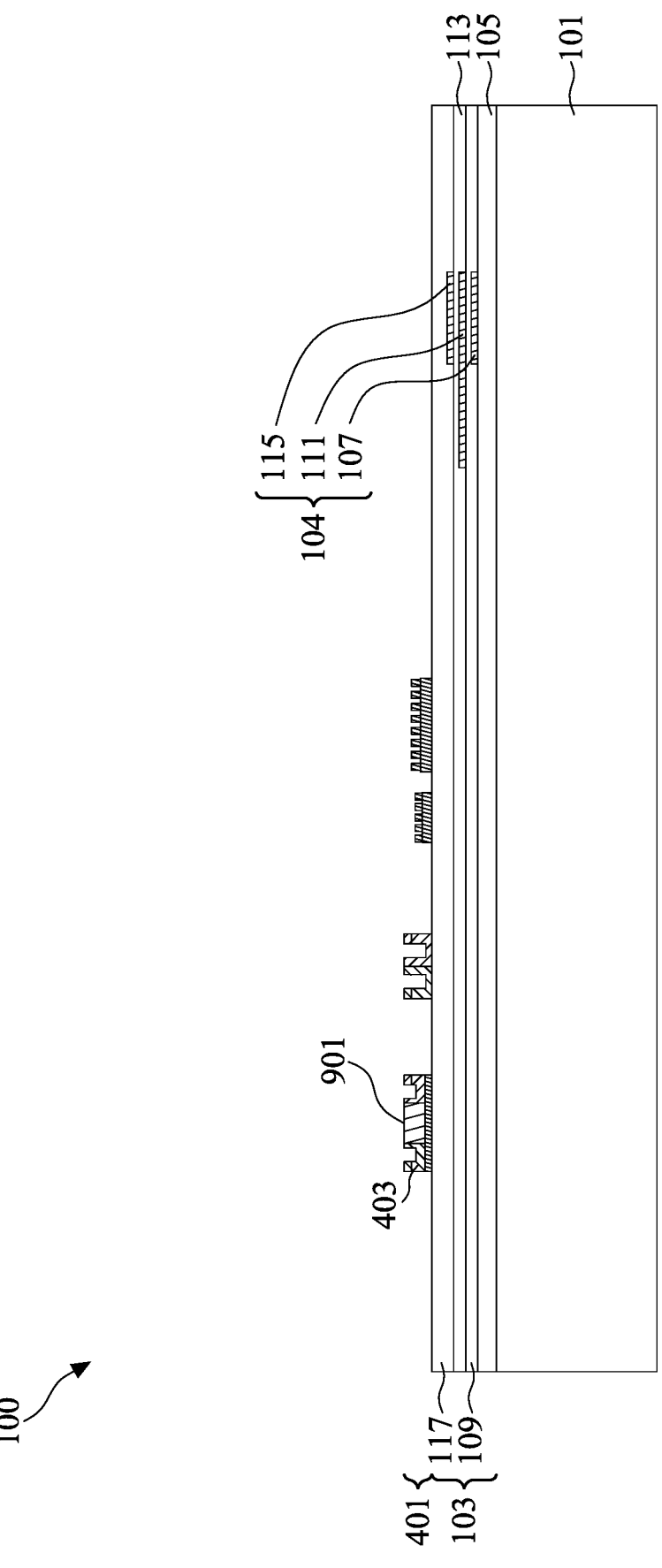

FIGS. 7-9 illustrate another method of forming the second active layer 401 of second optical components 403 after the forming the first active layer 103. In this embodiment, and looking first at FIG. 7, instead of depositing the crystalline insulator layer 201 onto the fourth cladding layer 117 as illustrated and discussed above with respect to FIG. 2, the crystalline insulator layer 201 is not deposited, and an amorphous layer 701 is deposited directly onto the fourth cladding layer 117. In this embodiment the amorphous layer 701 may be a similar material as the material 301 (described above with respect to FIG. 3), but which is deposited in an amorphous, non-crystalline form. In an embodiment in which the second optical components 403 are formed using silicon, the amorphous layer 701 may be amorphous silicon deposited using a deposition process such as CVD, PVD, ALD, combinations of these, or the like. However, any suitable material and any suitable process may be utilized.

FIG. 8 illustrates a patterning of the amorphous layer 701. In an embodiment the amorphous layer 701 may be patterned into the designed shapes for the second active layer 401 of second optical components 403. In an embodiment the amorphous layer 701 may be patterned using, e.g., one or more photolithographic masking and etching processes. For some of the second optical components 403, such as waveguides and couplers, this is all of the patterning that is performed. However, any suitable method of patterning the amorphous layer 701 may be utilized.

FIG. 9 illustrates that, once the amorphous layer 701 has been patterned into the designed shapes for the second optical components 403, further processing may be performed in order to form additional components for some of the second optical components 403. For example, for those components that utilize further manufacturing processes, such as Mach-Zehnder silicon-photonic switches that utilize resistive heating elements, additional processing may be performed either before or after the patterning of the material for the second active layer 401. For example, implantation processes, additional deposition and patterning processes for different materials (e.g., resistive heating elements, III-V materials for converters), combinations of all of these processes, or the like, can be utilized to help further the manufacturing of the various second optical components 403.

Additionally, in a particular embodiment, and as specifically illustrated in FIG. 9, in some embodiments a deposition of a second amorphous material 901 may be performed on a patterned portion of the amorphous layer 701. In an embodiment the second amorphous material 901 may be a similar material as the semiconductor material 405 (discussed above with respect to FIG. 4), but which is deposited in an amorphous, non-crystalline form. In an embodiment in which the semiconductor material 405 is germanium (used, e.g., for electricity/optics signal modulation and transversion), the second amorphous material 901 is deposited on the patterned amorphous layer 701. All such manufacturing processes may be utilized and all suitable second optical components 403 may be manufactured, and all such combinations are fully intended to be included within the scope of the embodiments.

Figure 10:
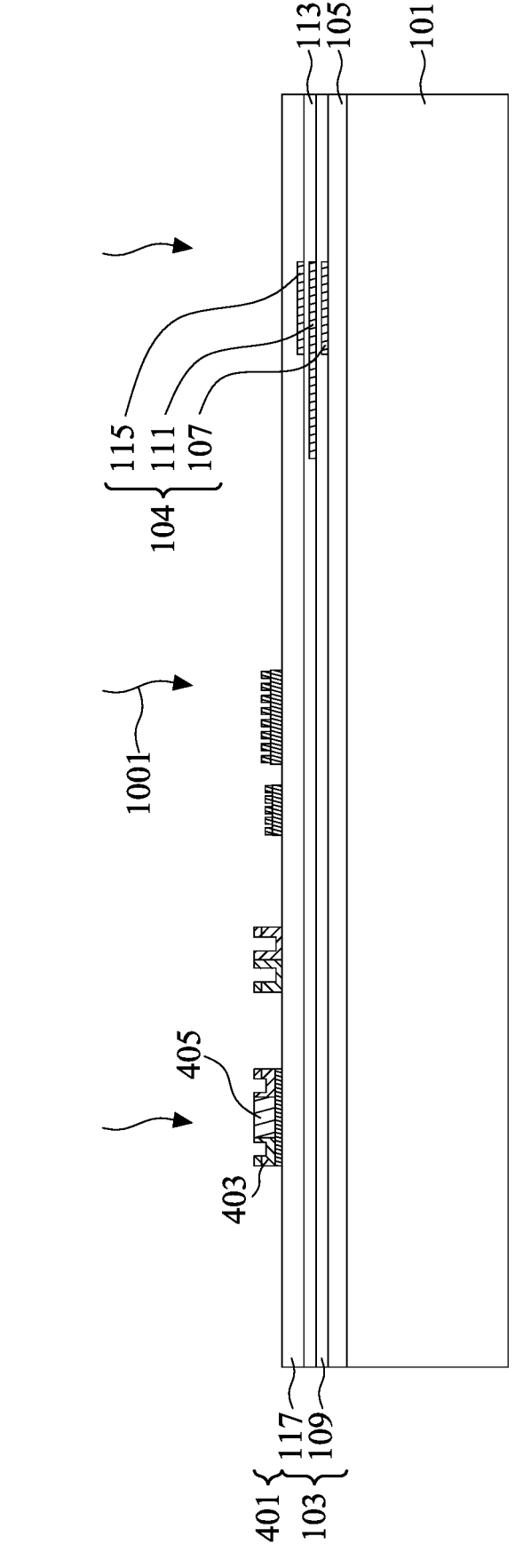

FIG. 10 illustrates that, once the various materials for the second optical components 403 have been formed with amorphous materials such as the amorphous layer 701 and the second amorphous material 901, the patterned material of the amorphous layer 701 and the second amorphous material 901 are annealed with a second anneal process (represented in FIG. 10 by the wavy lines labeled 1001) in order to change the material of the amorphous layer 701 and the second amorphous material 901 into crystalline materials in order to improve the quality of the second optical components 403.

In an embodiment the second anneal process 1001 may be a laser anneal which is performed sequentially on each single device of the second optical components 403. In such an embodiment, the laser anneal process may be performed with an energy density of between about 0.2 J/cm$^2$ and about 2 J/cm$^2$ for a time period of between about 10 nsec and about 1 μsec. As such, the laser anneal can raise the temperature of the various amorphous materials and convert the amorphous materials into single crystal materials. However, any suitable process conditions can be utilized.

However, in other embodiments a furnace anneal may be utilized in order to anneal all of the second optical components 403 simultaneously. In this embodiment, the second anneal process 1001 may be a thermal anneal process using a furnace performed at a temperature of between about 1100° C. and about 1300° C. for a time period of between about 60 min and about 120 min. However, any other suitable annealing process and suitable temperature may be utilized.

Of course, while a particular set of depositions and annealing has been presented above, this is merely intended to be an illustrative description and it is not intended to limit the embodiments. Rather, any suitable combination of depositions of amorphous materials, anneals, and subsequent depositions may be utilized. For example, in yet other embodiments, the amorphous layer 701 may be deposited and patterned, the second anneal process 1001 may be performed to crystalline the amorphous layer 701 into the material 301, and then the various devices are built after crystalline formation. For example, the semiconductor material 405 may be deposited using, e.g., an epitaxial growth deposition process after the second anneal process 1001 is performed. Any suitable method and combination of steps may be utilized in order to utilize an amorphous deposition and crystallization process as part of the formation of the second optical components 403. All such steps and combinations are fully intended to be included within the scope of the embodiments.

Figure 11:
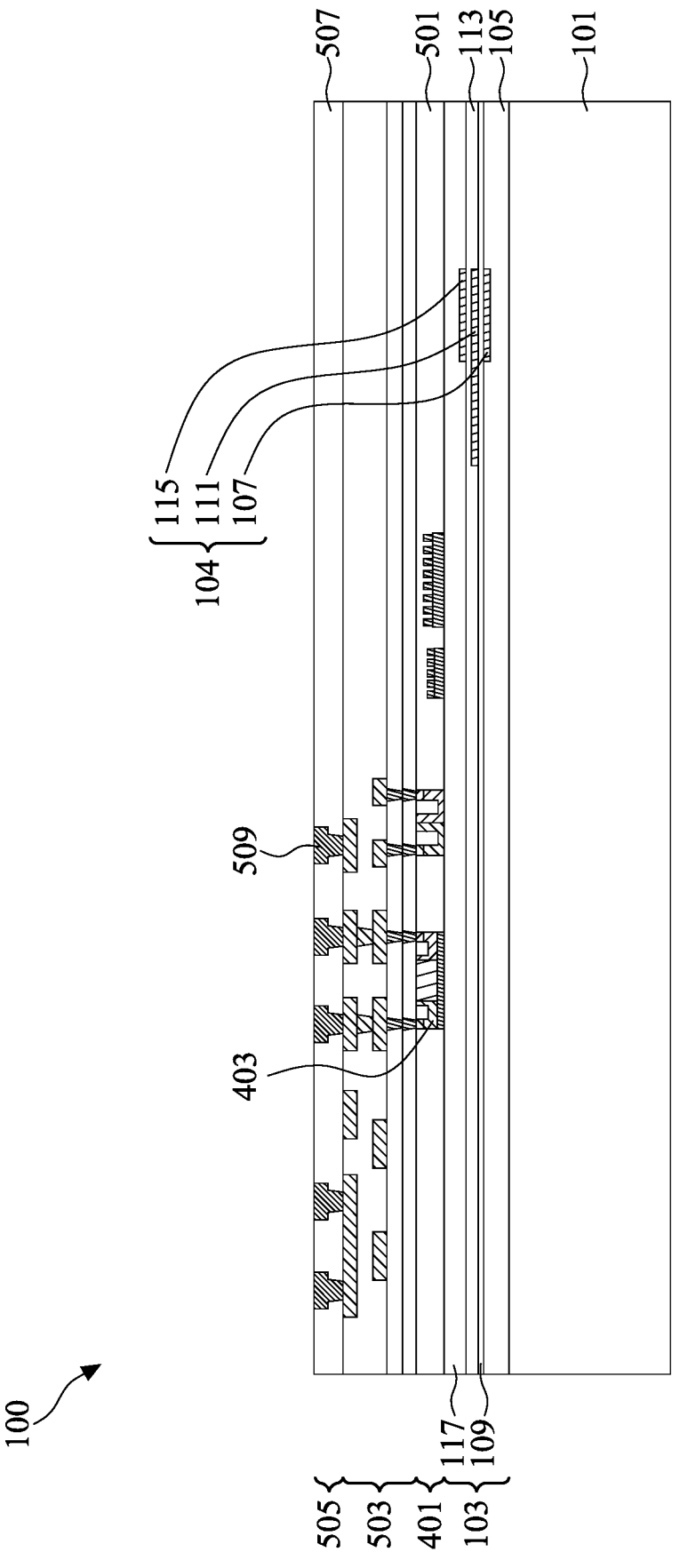

FIG. 11 illustrates that, once the second anneal process 1001 has been performed, a remainder of the process steps described above with respect to FIGS. 5-6 may be performed. For example, the second insulator layer 501 may be deposited, the first metallization layers 503 may be formed over the second insulator layer 501, and the first bonding layer 505 may be formed over the first metallization layers 503. However, any suitable number of process steps and structures may be used.

By utilizing a method of forming the second optical components 403 using an amorphous deposition and crystallization process, additional options for forming the second optical components 403 are available. As such, manufacturers can still form the first optical components 104 as described herein while still finding the most efficient process to manufacture the overall device.

FIGS. 12-15 illustrate yet another embodiment in which the first active layer 103 is formed and annealed prior to formation of the second active layer 401. In this embodiment, however, instead of depositing a crystalline layer (as described above with respect to the FIGS. 1-6) or else depositing an amorphous layer and crystallizing the material (as described above with respect to FIGS. 7-11), the second active layer 401 is formed using a silicon on insulator (SOI) 1201. In a particular embodiment the SOI 1201 comprises a second substrate 1203, a first insulator layer 1205, and a material 1207 for the second optical components 403. Looking first at the second substrate 1203, the second substrate 1203 may be a semiconductor material such as silicon or germanium, a dielectric material such as glass, or any other suitable material that allows for structural support of overlying layers.

The first insulator layer 1205 may be a dielectric layer that separates the second substrate 1203 from the overlying material 1207. In an embodiment the first insulator layer 1205 may be silicon oxide, silicon nitride, germanium oxide, germanium nitride, combinations of these, or the like, formed using a method such as implantation (e.g., to form a buried oxide (BOX) layer) or else may be deposited onto the second substrate 1203 using a deposition method such as chemical vapor deposition, atomic layer deposition, physical vapor deposition, combinations of these, or the like. However, any suitable material and method of manufacture may be used.

The material 1207 is initially (prior to patterning) a conformal layer of material that will be used to begin manufacturing the second active layer 401 of the second optical components 403. In an embodiment the material 1207 for the second active layer 401 may be a translucent material that can be used as a core material for the second optical components 403, such as a semiconductor material such as silicon, germanium, silicon germanium, combinations of these, or the like, while in other embodiments the material 1207 for the second active layer 401 may be a dielectric material such as silicon nitride or the like, although in other embodiments the material 1207 for the second active layer 401 may be III-V materials, lithium niobate materials, or polymers. In embodiments in which the material 1207 of the second active layer 401 is deposited, the material 1207 for the second active layer 401 may be deposited using a method such as epitaxial growth, chemical vapor deposition, atomic layer deposition, physical vapor deposition, combinations of these, or the like. In other embodiments in which the first insulator layer 1205 is formed using an implantation method, the material 1207 of the second active layer 401 may initially be part of the second substrate 1203 prior to the implantation process to form the first insulator layer 1205. However, any suitable materials and methods of manufacture may be utilized to form the material 1207 of the second active layer 401.

Figure 12:
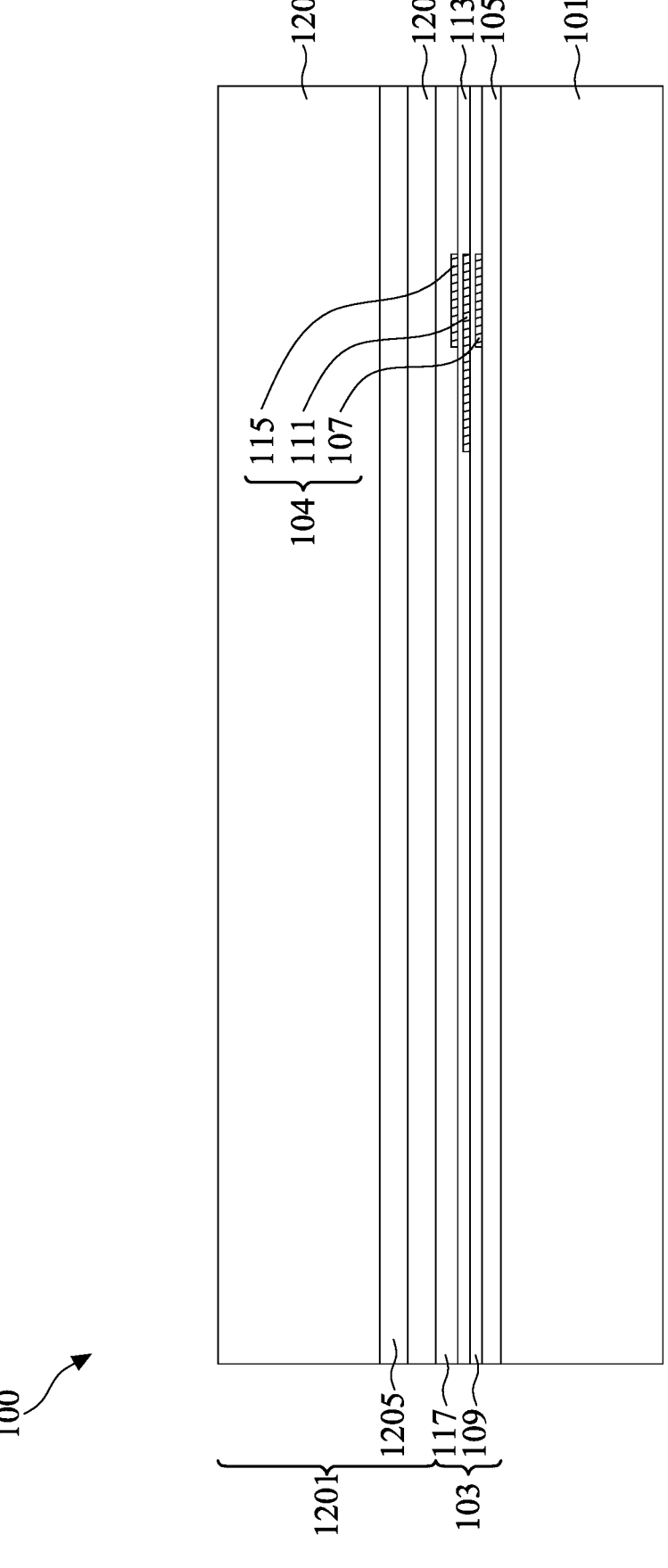
FIGS. 12-15 illustrate formation of the optical components using a silicon on insulator substrate.

FIG. 12 additionally illustrates a bonding of the SOI 1201 to the fourth cladding layer 117. To begin the process of bonding the SOI 1201 to the fourth cladding layer 117, the surfaces of the SOI 1201 and the surfaces of the fourth cladding layer 117 may initially be activated. Activating the top surfaces of the SOI 1201 and the fourth cladding layer 117 may comprise a dry treatment, a wet treatment, a plasma treatment, exposure to an inert gas plasma, exposure to $H_2$, exposure to $N_2$, exposure to $O_2$, combinations thereof, or the like, as examples. In embodiments where a wet treatment is used, an RCA cleaning may be used, for example. In another embodiment, the activation process may comprise other types of treatments. The activation process assists in the bonding of the SOI 1201 to the fourth cladding layer 117.

After the activation process, the SOI 1201 and the fourth cladding layer 117 may be placed into physical contact. In an embodiment the SOI 1201 is placed into physical contact with the fourth cladding layer 117 using, e.g., an alignment process in order to minimize overlay differences during the placement process. With the activation process chemically modifying the surfaces, the bonding process between the materials is begun upon the physical contact.

Once physical contact has begun the bonding process, the bonding may then be strengthened by subjecting the assembly to a thermal treatment. In an embodiment the SOI 1201 and the fourth cladding layer 117 may be subjected to a temperature between about 200° C. and about 400°° C. to strengthen the bond. In this manner, fusion of the SOI 1201 and the fourth cladding layer 117 forms a bonded device.

Additionally, while specific processes have been described to initiate and strengthen the bonds between the SOI 1201 to the fourth cladding layer 117, these descriptions are intended to be illustrative and are not intended to be limiting upon the embodiments. For example, in other embodiments a portion of the material 1207 may be oxidized prior to the start of the bonding process to initiate an oxide-to-oxide bonding process. As such, any suitable combination of baking, annealing, pressing, or combination of processes may be utilized. All such processes are fully intended to be included within the scope of the embodiments.

Also, while one type of bonding has been described to bond the SOI 1201 to the fourth cladding layer 117, this as well is only intended to be illustrative and is not intended to be limiting upon the embodiments. Rather, any suitable method of bonding, such as dielectric-to-dielectric and metal-to-metal bonding, or the like, may also be utilized. Any suitable method of bonding the SOI 1201 to the fourth cladding layer 117 may be utilized, and all such methods are fully intended to be included within the scope of the embodiments.

Figure 13:
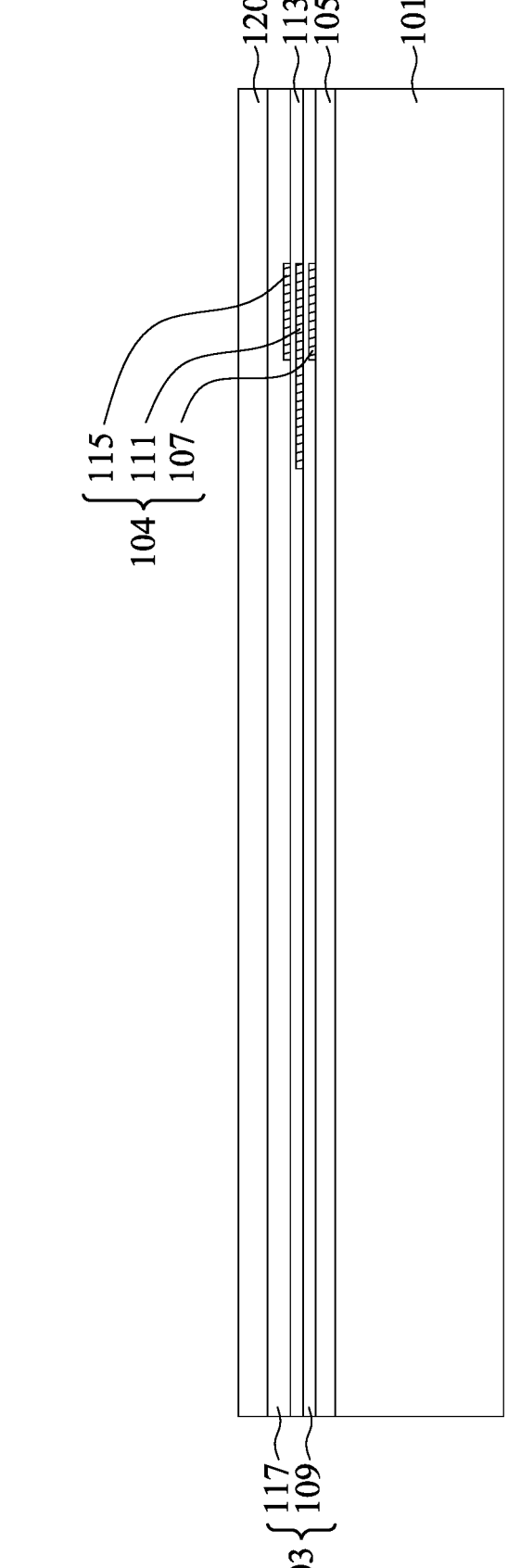

FIG. 13 illustrates that, once the SOI 1201 is bonded to the fourth cladding layer 117, the second substrate 1203 and the first insulator layer 1205 are removed. In an embodiment the second substrate 1203 and the first insulator layer 1205 may be removed using a planarization process, such as a chemical mechanical polishing process, a grinding process, or the like. However, any suitable removal process, such as one or more etching process to sequentially remove the materials of the second substrate 1203 and the first insulator layer 1205, may be used. All such removal processes are fully intended to be included within the scope of the embodiments.

Figure 14:
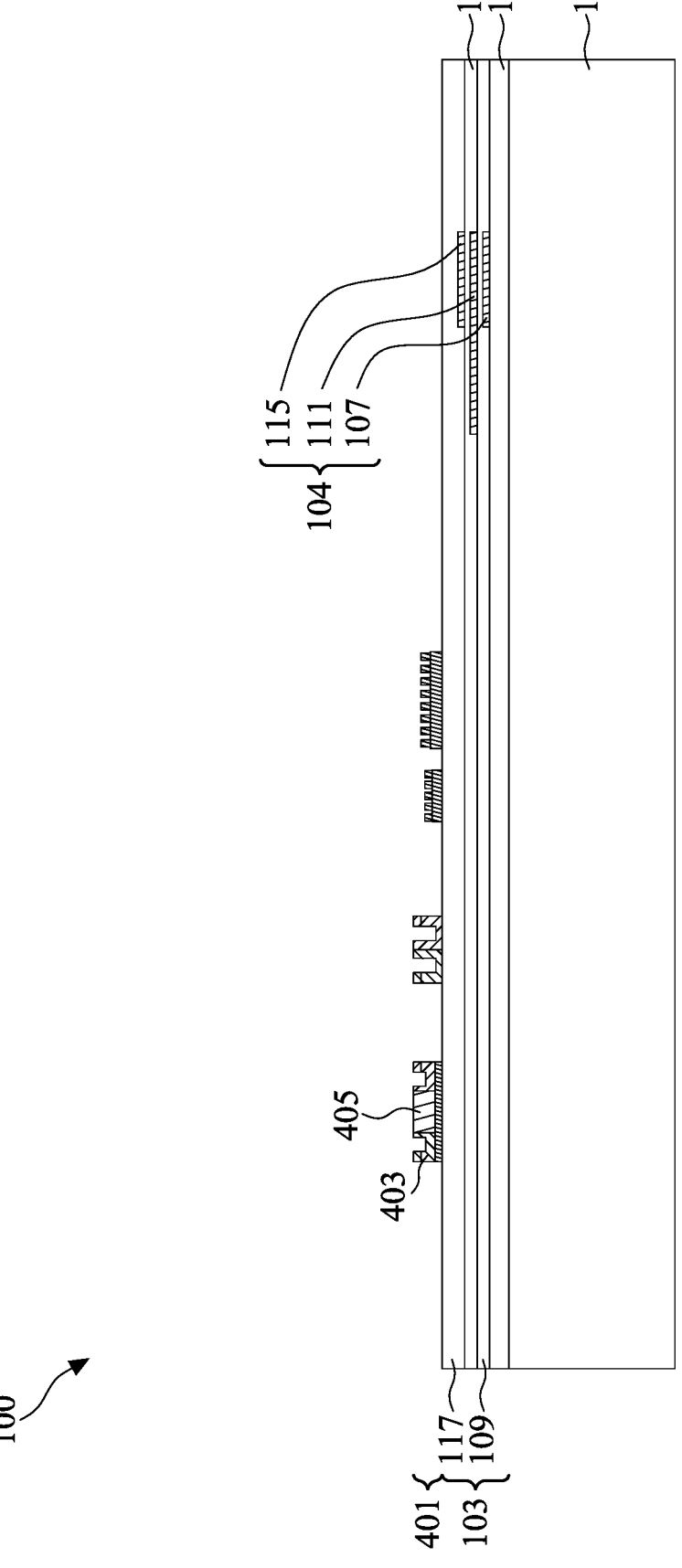

FIG. 14 illustrates that, once the second substrate 1203 and the first insulator layer 1205 have been removed to expose the material 1207, the material 1207 may be patterned into the designed shapes for the second optical components 403. In an embodiment the material 1207 may be patterned using, e.g., one or more photolithographic masking and etching processes. However, any suitable method of patterning the material 1207 for the second active layer 401 may be utilized. For some of the second optical components 403, such as waveguides or edge couplers, the patterning process may be all or at least most of the manufacturing that is used to form these second optical components 403.

Once the material 1207 has been patterned, for other optical components that utilize further processing, the further processing may be performed in order to form the second optical components 403. For example, for those components that utilize further manufacturing processes, such as Mach-Zehnder silicon-photonic switches that utilize resistive heating elements, additional processing may be performed either before or after the patterning of the material for the second active layer 401. For example, implantation processes, additional deposition and patterning processes for different materials (e.g., resistive heating elements, III-V materials for converters), combinations of all of these processes, or the like, can be utilized to help further the manufacturing of the various second optical components 403. In a particular embodiment, and as specifically illustrated in FIG. 14, in some embodiments an epitaxial deposition of the semiconductor material 405 such as germanium (used, e.g., for electricity/optics signal modulation and transversion) may be performed on a patterned portion of the material 1207. In such an embodiment the semiconductor material 405 may be epitaxially grown in order to help manufacture, e.g., a photodiode for an optical-to-electrical converter. All such manufacturing processes and all suitable second optical components 403 may be manufactured, and all such combinations are fully intended to be included within the scope of the embodiments.

Figure 15:
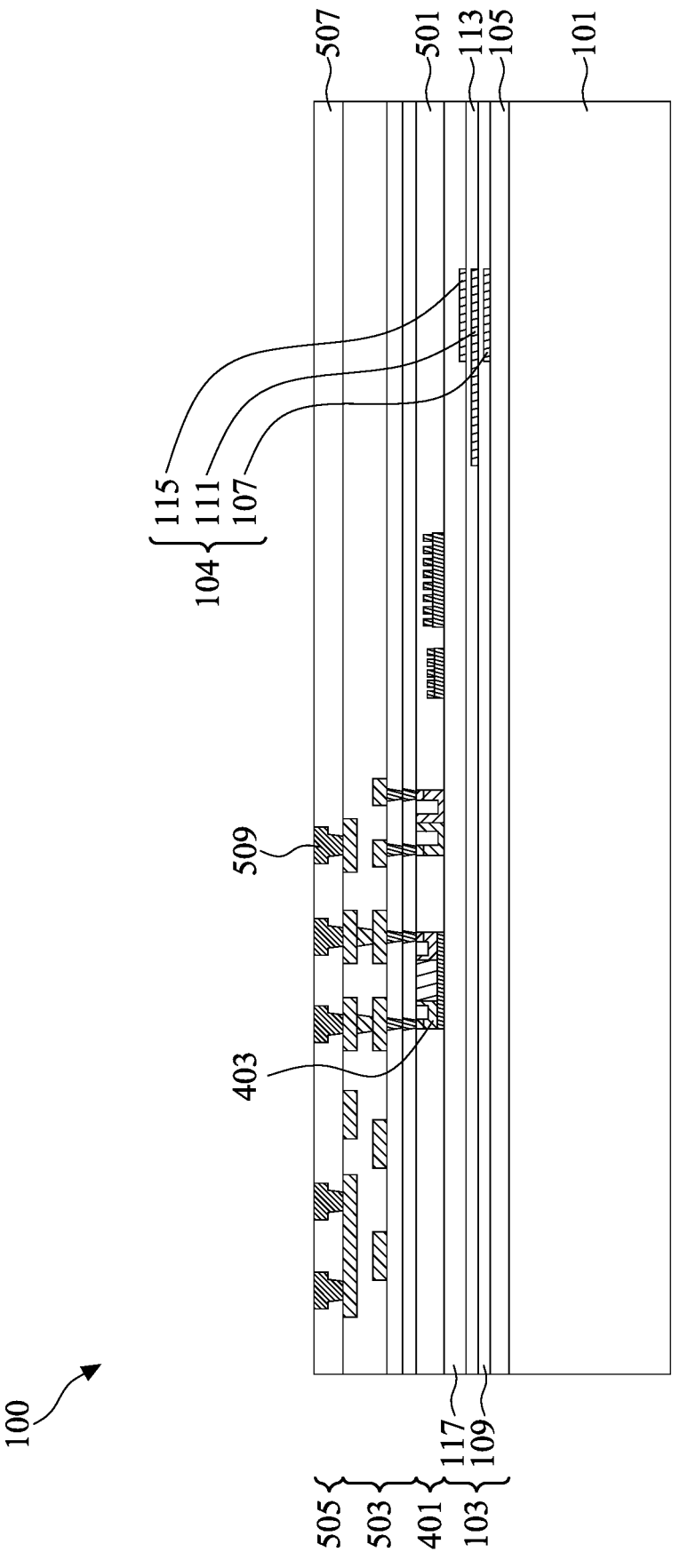

FIG. 15 illustrates that, once the second optical components 403 have been formed, a remainder of the process steps described above with respect to FIGS. 5-6 may be performed. For example, the second insulator layer 501 may be deposited, the first metallization layers 503 may be formed over the second insulator layer 501, and the first bonding layer 505 may be formed over the first metallization layers 503. However, any suitable number of process steps and structures may be used.

By forming the first active layer 103 of the first optical components 104 prior to forming any crystalline materials (used, e.g., for the formation of the second optical components 403 in the second active layer 401), the materials within the first active layer 103 of the first optical components 104 may be annealed at a higher temperature than appropriate for the subsequent crystalline materials (usually less than 450° C.). As such, the higher temperatures may be used in order to reduce defects within the materials for the first active layer 103 of the first optical components 104, thereby improving the overall quality of the materials for the first active layer 103 of the first optical components 104, and optical losses may be reduced. With such a reduction in optical losses within the first optical components 104, the surrounding cladding materials (e.g., the first cladding layer

105, the second cladding layer 109, the third cladding layer 113, and the fourth cladding layer 117) may also be formed to a smaller thickness, such as a 50% reduction in thickness, thereby reducing the overall thickness of the device.

In an embodiment, a method of manufacturing an optical device includes: forming a first active layer of first optical components on a substrate; and after the forming the first active layer, manufacturing second optical components with a crystalline semiconductor material. In an embodiment the method further includes annealing the first active layer of the first optical components prior to the manufacturing the second optical components. In an embodiment the annealing the first active layer is performed at a temperature of between about 1,100° C. and 1,250° C. In an embodiment the manufacturing the second optical components further comprises depositing a crystalline seed layer. In an embodiment the manufacturing the second optical components further comprises epitaxially growing the crystalline semiconductor material on the crystalline seed layer. In an embodiment the manufacturing the second optical components further comprises bonding the crystalline semiconductor material to the first active layer. In an embodiment the manufacturing the second optical components further includes: depositing an amorphous material; and crystallizing the amorphous material.

In another embodiment, a method of manufacturing an optical device, the method includes: depositing a core material on a substrate; annealing the core material; and after the annealing the core material, forming optical devices over the core material, the optical devices comprising crystalline material after the forming the optical devices. In an embodiment the annealing the core material is performed at a temperature of between about 1,100° C. and about 1,250° C. In an embodiment the forming the optical devices comprises crystallizing an amorphous material. In an embodiment the method further includes bonding a silicon-on-insulator structure to a cladding material over the core material. In an embodiment the method further includes removing a semiconductor substrate and an insulating layer from the silicon-on-insulator structure. In an embodiment the method further includes depositing a beryllium oxide material over the core material. In an embodiment the method further includes epitaxially growing the crystalline material on the beryllium oxide material.

In yet another embodiment, a method of manufacturing an optical device includes: receiving a substrate; depositing a cladding material over the substrate; depositing a core material over the cladding material; annealing the core material at a temperature greater than 1,100° C. to remove defects; after the annealing, forming a crystalline material over the core material; patterning the crystalline material to form an optical component; and forming metallization layers over the optical component. In an embodiment the substrate is single material substrate. In an embodiment the cladding material has a first thickness less than about 4 μm. In an embodiment the method further includes depositing a second cladding material over a topmost portion of the core material, the second cladding material having a second thickness between 2 μm and 4 μm. In an embodiment the forming the crystalline material further includes: depositing an aluminum nitride layer; and epitaxially growing the crystalline material on the aluminum nitride layer. In an embodiment the forming the crystalline material further includes: depositing a beryllium oxide material; and epitaxially growing the crystalline material on the beryllium oxide material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes. substitutions, and alterations herein without departing from the spirit and scope of the present disclosure.

What is claimed is:

1. A method of manufacturing an optical device, the method comprising:

forming a first active layer of first optical components on a substrate, the first active layer of first optical components comprising optical modulators, an amplifier, and a waveguide;

depositing a cladding material over the waveguide, the cladding material comprising a dielectric material; and after the forming the first active layer and the depositing the cladding material, manufacturing second optical components with a crystalline semiconductor material, wherein the manufacturing the second optical components comprises forming a crystalline silicon waveguide, second optical modulators, and a second amplifier.

2. The method of claim 1, further comprising annealing the first active layer of the first optical components prior to the manufacturing the second optical components, the waveguide of the first optical components comprising silicon nitride.

3. The method of claim 2, wherein the annealing the first active layer is performed at a temperature of between about 1,100° C. and 1,250° C.

4. The method of claim 1, wherein the manufacturing the second optical components further comprises depositing a crystalline seed layer.

5. The method of claim 4, wherein the manufacturing the second optical components further comprises epitaxially growing the crystalline semiconductor material on the crystalline seed layer.

6. The method of claim 1, wherein the manufacturing the second optical components further comprises bonding the crystalline semiconductor material to the first active layer.

7. The method of claim 1, wherein the manufacturing the second optical components further comprises:

depositing an amorphous material; and crystallizing the amorphous material.

8. A method of manufacturing an optical device, the method comprising:

depositing a core material on a substrate;

annealing the core material;

after the annealing, forming a waveguide, an amplifier, and an optical modulator from the core material; and after the forming the waveguide, forming optical devices over the core material, a waveguide within the optical devices comprising a crystalline material after the forming the optical devices, the optical devices comprising a second amplifier and a second optical modulator.

9. The method of claim 8, wherein the annealing the core material is performed at a temperature of between about 1,100° C. and about 1,250° C.

10. The method of claim 8, wherein the forming the optical devices comprises crystallizing an amorphous material.

11. The method of claim 8, further comprising bonding a silicon-on-insulator structure to a cladding material over the core material, the silicon-on-insulator structure comprising a semiconductor substrate and an insulating layer.

12. The method of claim 11, further comprising removing the semiconductor substrate and the insulating layer from the silicon-on-insulator structure, the semiconductor substrate being different from the substrate.

13. The method of claim 8, further comprising depositing a beryllium oxide material over the core material.

14. The method of claim 13, further comprising epitaxially growing the crystalline material on the beryllium oxide material.

15. A method of manufacturing an optical device, the method comprising:

receiving a substrate;

depositing a cladding material over the substrate;

depositing a core material over the cladding material;

shaping the core material into a shape for a waveguide and a micro-ring resonator;

annealing the core material at a temperature greater than 1,100° C. to remove defects;

after the annealing, forming a crystalline material over the core material;

patterning the crystalline material to form an optical component from the crystalline material, the optical component being a crystal silicon waveguide; and forming metallization layers over the optical component.

16. The method of claim 15, wherein the substrate is single material substrate.

17. The method of claim 15, wherein the cladding material has a first thickness less than about 4 μm.

18. The method of claim 15, further comprising depositing a second cladding material over a topmost portion of the core material, the second cladding material having a second thickness between 2 μm and 4 μm.

19. The method of claim 15, wherein the forming the crystalline material further comprises:

depositing an aluminum nitride layer; and epitaxially growing the crystalline material on the aluminum nitride layer.

20. The method of claim 15, wherein the forming the crystalline material further comprises:

depositing a beryllium oxide material; and epitaxially growing the crystalline material on the beryllium oxide material.

* * * * *